United States Patent [19]

Tadanobu et al.

[11] Patent Number: 4,562,378
[45] Date of Patent: Dec. 31, 1985

[54] GALLIUM PHOSPHIDE LIGHT-EMITTING DIODE

[75] Inventors: Yamazawa Tadanobu, Tottori; Inoue Kentaro, Mikata, both of Japan

[73] Assignees: Sanyo Electric Co., Ltd.; Tottori Sanyo Electric Co., Ltd., both of Japan

[21] Appl. No.: 509,186

[22] Filed: Jun. 29, 1983

[30] Foreign Application Priority Data

Jul. 8, 1982 [JP] Japan ................. 57-119207
Jul. 8, 1982 [JP] Japan ................. 57-119208

[51] Int. Cl.$^4$ .......................................... H01L 33/00
[52] U.S. Cl. ..................................... 313/499; 313/498
[58] Field of Search ............... 313/499, 498, 500, 501; 357/17

[56] References Cited

U.S. PATENT DOCUMENTS 4,354,140  10/1982  Nishizawa ........................ 313/499

FOREIGN PATENT DOCUMENTS 2602801  8/1976  Fed. Rep. of Germany ...... 313/499

Primary Examiner—David K. Moore
Attorney, Agent, or Firm—Darby & Darby

[57] ABSTRACT

A gallium phosphide light-emitting diode comprises n-type layers (21 to 23) formed successively on an n-type substrate (20). The impurity concentration of the first n-type layer (21) is higher than the impurity concentration of the n-type substrate (20), (1 to 3)$\times 10^{17}$cm$^{-3}$, and is for example (5 to 8)$\times 10^{17}$cm$^{-3}$. The impurity concentration of the second n-type layer (23) is lower than that of the n-type substrate (20) and is for example (0.6 to 3)$\times 10^{16}$cm$^{-3}$. Since the impurity concentration of the second n-type layer (23) is decreased, a high electroluminescence efficiency can be obtained. Furthermore, since the first n-type layer (21) has a high impurity concentration, perfection of crystal can be attained for each n-type layer and accordingly, switching operation is not caused.

12 Claims, 9 Drawing Figures

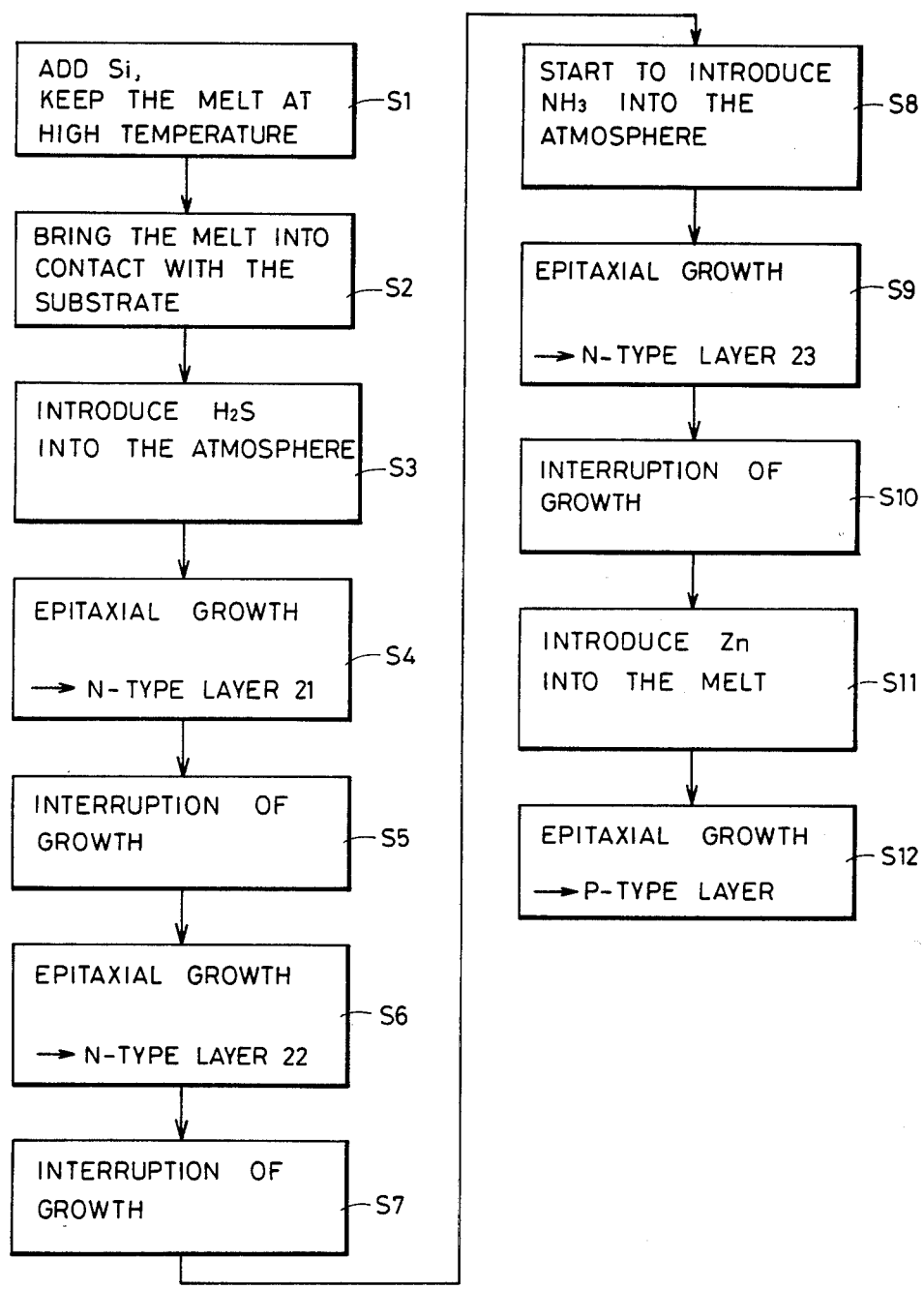

GALLIUM PHOSPHIDE LIGHT-EMITTING DIODE

BACKGROUND OF THE INVENTION

1. Field of the Invention

The present invention relates to a gallium phosphide light-emitting diode and particularly, relates to a gallium phosphide light-emitting diode which emits green light.

2. Description of the Prior Art

Conventionally, in a light-emitting diode using gallium phosphide GaP, a method of decreasing the concentration of an n-type layer of pn junction has been known as an effective method for emitting green light with high efficiency. In page 537 of Toshiba Review Vol. 37 No. 6, it is reported that electroluminescence efficiency of approximately 0.3% can be stably obtained if an n-type layer is divided into two layers so that impurity concentration has values changed in steps. This will be described in the following with reference to the drawings. FIG. 1 is a view showing typically a conventional gallium phosphide light-emitting diode. FIG. 2 is a schematic view showing distribution of impurity concentration for each portion of the light-emitting diode in FIG. 1. A conventional gallium phosphide light-emitting diode 1 comprises an n-type layer 11 formed on an n-type substrate 10, an n-type layer 12 formed on the n-type layer 11 and a p-type layer 13 formed on the n-type layer 12. The impurity concentration for the n-type layers 11 and 12 is changed in steps, as shown in FIG. 2. However, such distribution of impurity concentration often causes switching operation (that is, operation as a thyristor or as a transistor). An experiment was made to investigate the cause, and in consequence, it has become clear that in case of simply decreasing the concentration of the n-type layer near the pn junction, there exist a large amount of electric current and other factors which do not serve to emit light in the n-type layer and that certain impurities act as a minority carrier to cause switching operation. More particularly, in the n-type layer, regions where the acceptor concentration is higher than the donor concentration are produced and p-type inversion is made only in such regions. Accordingly, undesirable npnp junction or npn junction is produced, which causes switching operation. Therefore, it has proved to be necessary to grow n-type layers adjusting the perfection of crystal (especially lattice matching or dislocation in the regions of different impurity concentrations), as well as to decrease the impurity concentration of the n-type layer near the pn junction.

SUMMARY OF THE INVENTION

The present invention is, in brief, directed to a gallium phosphide light-emitting diode which comprises an n-type substrate of gallium phosphide, a first n-type layer formed on the n-type substrate and having impurity concentration higher than that of the n-type substrate, a second n-type layer formed on or above the first n-type layer and having impurity concentration lower than that of the n-type substrate and a p-type layer formed on the second n-type layer for forming pn junction with the second n-type layer.

In accordance with the present invention, the impurity concentration of the second n-type layer is lower than that of the n-type substrate and accordingly, carrier injection efficiency from the p-type layer to the second n-type layer is improved. As a result, electroluminescence efficiency is increased. Furthermore, since the first n-type layer of high impurity concentration is provided, perfection of crystal for each n-type layer is adjusted. Therefore, it is confirmed that no switching operation occurs.

Accordingly, a principal object of the present invention is to provide a gallium phosphide light-emitting diode having high electroluminescence efficiency which does not cause switching operation.

A principal advantage of the present invention is that high electroluminescence efficiency is obtained, causing no switching operation.

Another advantage of the present invention is that a diode in accordance with the present invention has a long lifetime.

These objects and other objects, features, aspects and advantages of the present invention will become more apparent from the following detailed description of the present invention when taken in conjunction with the accompanying drawings.

BRIEF DESCRIPTION OF THE DRAWING

FIG. 6 is a flow chart showing manufacturing steps of a light-emitting diode of an embodiment in accordance with the present invention.

DESCRIPTION OF THE PREFERRED EMBODIMENTS

Figure 1:
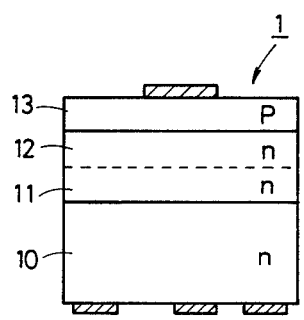
FIG. 1 is a view typically showing a conventional gallium phosphide light-emitting diode.
Figure 2:
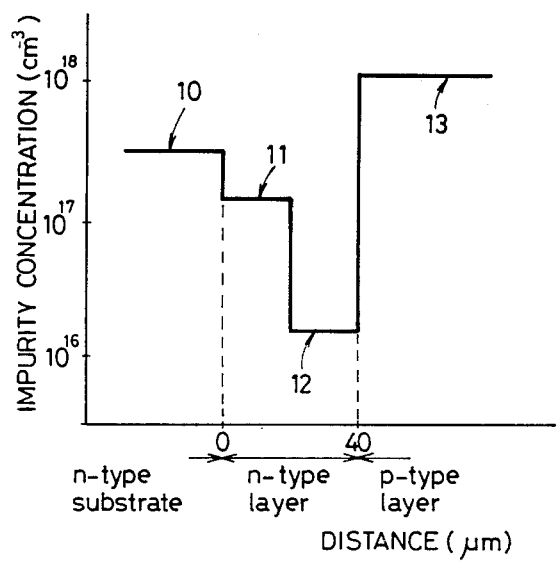
FIG. 2 is a schematic view showing distribution of impurity concentration in each portion of a light-emitting diode in FIG. 1.
Figure 3:
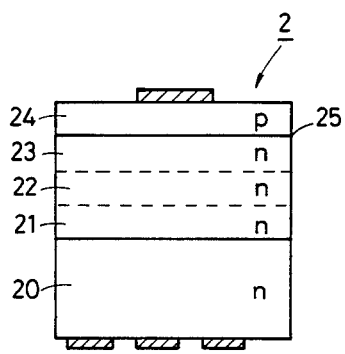
FIG. 3 is a view typically showing a gallium phosphide light-emitting diode of an embodiment in accordance with the present invention.
Figure 4:
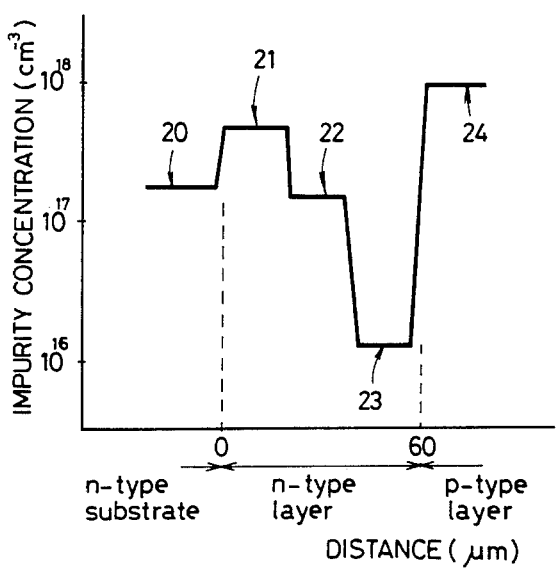
FIG. 4 is a schematic view showing distribution of impurity concentration in each portion of a light-emitting diode shown in FIG. 3.

FIG. 3 is a view showing typically a gallium phosphide light-emitting diode of an embodiment in accordance with the present invention. FIG. 4 is a schematic view showing distribution of impurity concentration in each portion of a light-emitting diode shown in FIG. 3. A gallium phosphide light-emitting diode 2 of an embodiment in accordance with the present invention comprises an n-type substrate 20, an n-type layer 21 formed on the n-type substrate 20, an n-type layer 22 formed on the n-type layer 21, an n-type layer 23 formed on the n-type layer 22 and a p-type layer 24 formed on the n-type layer 23. A pn junction 25 is formed between the n-type layer 23 and the p-type layer 24. The n-type substrate 20 whose impurity concentration is $(1 \text{ to } 3) \times 10^{17} \text{ cm}^{-3}$ is a slice of single crystal manufactured by a method of LEC (Liquid Encapsulated Czochralski) and the like. The n-type layers 21 to 23 are epitaxial growth layers having respectively impurity concentration valued $(5 \text{ to } 8) \times 10^{17} \text{ cm}^{-3}$, $(1 \text{ to } 2) \times 10^{17} \text{ cm}^{-3}$ and $(0.6 \text{ to } 3) \times 10^{16} \text{ cm}^{-3}$. The n-type layers 21 to 23 have growth thickness 40 to 50 $\mu$m, 15 to 25 $\mu$m and 8 to 14 $\mu$m, respectively. Among these n-type layers, only the uppermost n-type layer 23 is doped with nitrogen. The impurity concentration of the p-type layer 24 is $(5 \text{ to } 10) \times 10^{17} \text{ cm}^{-3}$ and the growth thickness thereof is approximately 25 $\mu$m. The distribution of the impurity concentration values in the respective portions of the light-emitting diode as described above can be easily seen from FIG. 4.

Figure 5:
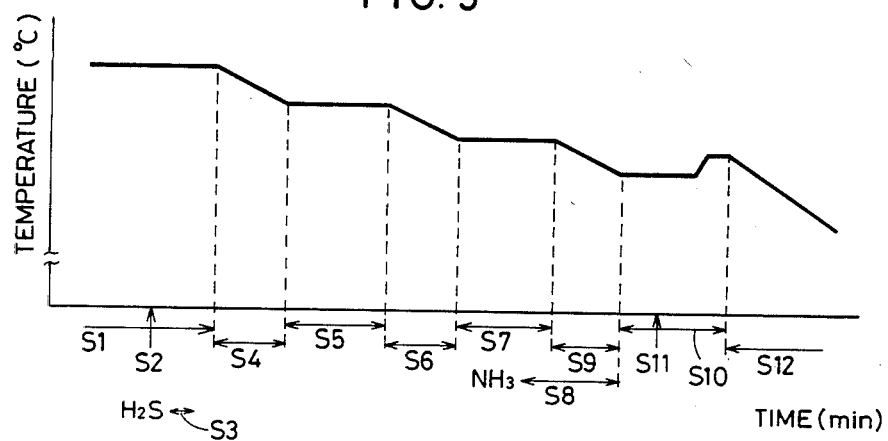
FIG. 5 is a view showing temperature steps of liquid phase epitaxial growth of a light-emitting diode of an embodiment in accordance with the present invention.

The light-emitting diode 2 as shown in FIG. 3 can be manufactured, for example, by a manufacturing method as described below. FIG. 5 is a view showing temperature steps of epitaxial growth of a light-emitting diode. FIG. 6 is a flow chart showing manufacturing steps of a light-emitting diode. In the step S1, polycrystal of gallium phosphide GaP, n-type impurity and a slight amount of silicon are mixed into a melt of gallium Ga so as to make a melt, which is put in a place other than the semiconductor substrate at a high temperature, for example, 1030° C. After the melt is kept at 1030° C. for a moment, in the step S2, the melt is supplied to the semiconductor substrate so that the surface of the substrate gets wet with it. In the step S3, before the epitaxial growth, hydrogen sulphide $H_2S$ gas is introduced into the atmosphere so as to increase the impurity concentration of the melt. The introduction of hydrogen sulphide $H_2S$ gas into the atmosphere is made with high density such as 5.0 cc/min in a short period of time. In the step S4, the temperature is reduced with a low speed such as 2 to 3.5° C. per minute so as to epitaxially grow an n-type layer 21. The n-type layer 21 has impurity concentration $(5 \text{ to } 8) \times 10^{17} \text{ cm}^{-3}$ which is higher than that of the substrate 20, $(1 \text{ to } 3) \times 10^{17} \text{ cm}^{-3}$. In the impurity concentration of the n-type layer 21, a value $(5 \text{ to } 6) \times 10^{16} \text{ cm}^{-3}$ is based on the above mentioned silicon Si. Since the amount of silicon to the main sulfur impurity is extremely small, introduction of silicon Si into the melt as described above need not be specially made in case where a sufficient amount of silicon is dissolved into the melt from a reaction system such as a quartz tube and other recipients exposed to high temperature. For the epitaxial growth, it is preferred that the melt is 2.1 to 2.8 mm in thickness and has a grating and the like used as a cover in the upper surface so that the melt can be in contact with the atmosphere. Although a small thickness of the melt as described above has a tendency to decrease only the growth layer, a long lifetime is given if the pn junction is kept away from the substrate, and the amount of growth can be increased in a short period of time if a saturated state is maintained with polycrystal of gallium phosphide GaP of more than 4.0 weight percent in the melt. In the step S5, an interrupting period of epitaxial growth is continued for 45 to 120 minutes approximately. In the step S6, epitaxial growth is further made so as to form an n-type layer 22. In the step S7, in the same manner as in the step S5, an interrupting period of epitaxial growth continues for 45 to 120 minutes approximately. In the step S8, ammonia $NH_3$ gas starts to be introduced into the atmosphere. In the step S9, in the atmosphere containing ammonia gas, epitaxial growth is made again to form an n-type layer 23. As described above, interrupting periods (periods in which constant temperature is maintained) are given and as a result, the dislocation density in the crystal is decreased, but simultaneously the impurity concentration in the melt is also decreased. Accordingly, n-type layers with gradually lowered values of impurity concentration can be obtained in order. Particularly in the epitaxial growth in the step S9, ammonia gas and the silicon Si in the melt interact to deposit silicon nitride $Si_3N_4$ and the like, and the silicon Si in the melt is substantially removed to have an amount reduced to $\frac{1}{4}$ to 1/10 of the initial amount. Accordingly, although nitrogen is contained, an n-type layer 23 of extremely low impurity concentration such as $10^{16} \text{ cm}^{-3}$ is formed. In the step S10, an interrupting period continues approximately for 45 to 120 minutes. In the step S11, zinc Zn is introduced into the melt. In the step S12, epitaxial growth is made to form a p-type layer 24.

Figure 7:
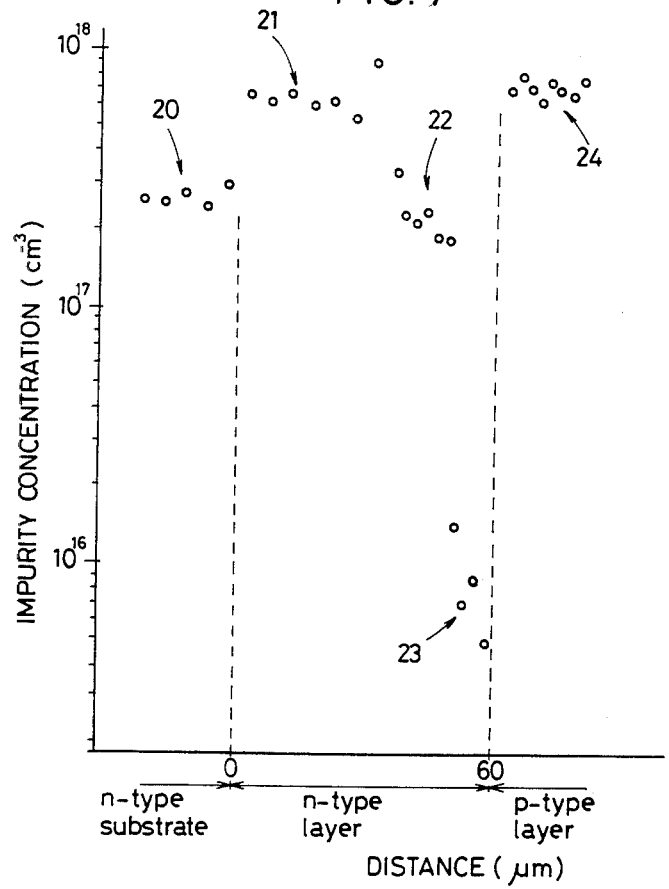
FIG. 7 shows measured values in the distribution of impurity concentration in the respective portions of a light-emitting diode of an embodiment in accordance with the present invention.

FIG. 7 shows measured values of impurity concentration in the respective portions of a light-emitting diode manufactured by a manufacturing process as described above. Referring to FIG. 7, it can be seen that the impurity concentration of the n-type layer 22 decreases gradually from the side of the n-type layer 21 to the side of the n-type layer 23.

Since the light-emitting diode 2 obtained by a manufacturing process as described above has an n-type layer 21 of high impurity concentration on the n-type substrate 20, perfection of crystal (particularly lattice matching or dislocation in regions having different concentrations) can be adjusted. Furthermore, an n-type layer 23 of low impurity concentration can be obtained. Accordingly, by far higher electroluminescence efficiency (0.45%) can be obtained as compared with electroluminescence efficiency of a conventional light-emitting diode (0.2 to 0.3%) and it is ascertained that no switching operation occurs. In addition, in a test of a high temperature with a large amount of current (50° C., 40mA), a light-emitting diode of a long lifetime in which degradation in brightness to 80% was caused after more than 1500 hours was obtained. Furthermore, since the melt thickness is small, the epitaxial growth layer thickness on the substrate is approximately uniform and accordingly, manufacturing operation in the subsequent steps such as fixation of electrodes becomes easier and productivity is increased.

Now, a more detailed description will be made of each portion of a light-emitting diode of an embodiment in accordance with the present invention. First, the n-type substrate 20 will be described. The impurity concentration of the n-type substrate 20 is preferably $(1 \text{ to } 3) \times 10^{17} \text{ cm}^{-3}$. With too small a value of impurity concentration, bulk resistance would be increased and it would be difficult to make an ohmic contact for electrodes. On the contrary, with too large a value of impurity concentration, light absorption would be increased. The above described value is the same as that in a conventional light-emitting diode.

Figure 8:
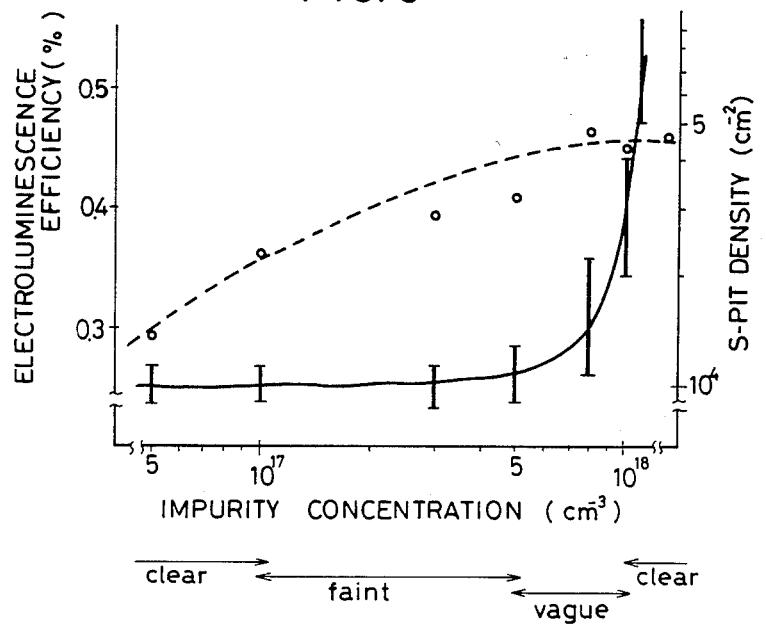
FIG. 8 shows curves representing a relation between the impurity concentration of a first n-type layer, electroluminescence efficiency and S-pit density in a light-emitting diode of an embodiment in accordance with the present invention.

Next, the n-type layer 21 will be described. The impurity concentration of the n-type layer 21 is preferably $(3 \text{ to } 10) \times 10^{17} \text{ cm}^{-3}$ and more preferably $(5 \text{ to } 8) \times 10^{17} \text{ cm}^{-3}$. This will be explained with reference to FIG. 8. FIG. 8 shows curves indicating a relation between the impurity concentration of the first n-type layer 21, electroluminescence efficiency and S-pit density in a light-emitting diode of an embodiment in accordance with the present invention. In FIG. 8, a dotted line indicates an electroluminescence efficiency and a solid line indicates S-pit density. If the impurity concentration is increased, the electroluminescence efficiency also increases but begins to be saturated at a certain point. The S-pit density increases abruptly when the impurity concentration exceeds approximately $10^{18}$ cm$^{-3}$. In consequence, nonradiative recombination will be unfavorably caused. Therefore, the impurity concentration of the n-type layer 21 is preferably (3 to 10)$\times 10^{17}$ cm$^{-3}$ and more preferably (5 to 8)$\times 10^{17}$ cm$^{-3}$. This is because in case where the impurity concentration has such a preferable value, a fine matching for perfection of crystal between the n-type substrate 20 and the n-type layer 21 is obtained. Such matching for perfection of crystal can be confirmed if the vicinity of the boundary between the n-type substrate 20 and the n-type layer 21 is etched so as to inspect by a microscope the state of the boundary. As etchant for etching, mixture of nitric acid and fluoric acid for example is used. The etching speed varies in the crystal-face and in the junction of crystals, and if crystal matching is not successfully made, a black line appears. In the lower part of FIG. 8, results of a microscope inspection of the boundary between the n-type substrate 20 and the n-type layer 21 are shown. In case where the impurity concentration is up to approximately $1\times 10^{17}$ cm$^{-3}$, the boundary is clear. In the case where the impurity concentration is in the range of $1\times 10^{17}$ cm$^{-3}$ to $5\times 10^{17}$ cm$^{-3}$, the boundary is faint. In case where the impurity concentration is approximately (5 to 10)$\times 10^{17}$ cm$^{-3}$, the boundary is vague. When the impurity concentration exceeds $10^{18}$ cm$^{-3}$, the boundary becomes clear again. Accordingly, it is understood that a good matching between the n-type substrate 20 and the n-type layer 21 is realized in case where the impurity concentration is (5 to 10)$\times 10^{17}$ cm$^{-3}$. It was verified by an experiment that if the impurity (donor) of the n-type layer 21 is comprised simply of sulfur S, a black line in the boundary does not disappear and that p inversion is apt to occur if silicon Si is used as a main impurity (donor). Accordingly, if sulfur S is contained as a main impurity for the n-type layer 21 and a slight amount of silicon Si is further contained, matching for perfection of crystal is supposed to be in a higher degree. The thickness of the n-type layer 21 is more than 35 μm, preferably 40 to 50 μm, for example. This is because the influence of the n-type substrate 20 should be preferably effaced on the epitaxial growth layer provided on the substrate 20 and in general if the thickness of the n-type layer 21 is less than 15 μm, irregularities are caused in the epitaxial growth, and if less than 35 μm, influence of the substrate 20 partially remains.

Now, the n-type layer 22 will be described. This layer is not necessarily needed. It may be omitted. However, if the n-type layer 22 is provided, it is made easier to prevent sulfur S from remaining in the next layer 23. In case where the n-type layer 22 is provided, the impurity concentration of the n-type layer 22 may be gradually and smoothly decreased from the n-type layer 21 side to the n-type layer 23 side (see FIG. 7). Otherwise, the impurity concentration of the layer 22 may be decreased by steps (see FIG. 4).

Figure 9:
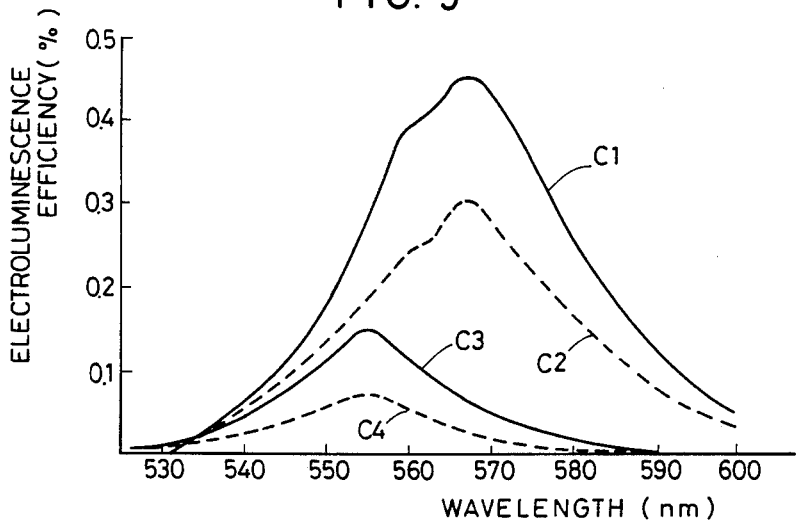
FIG. 9 is a characteristic view representing relation between wavelength and electroluminescence efficiency in various light-emitting diodes.

The n-type layer 23 will be described in the following. The impurity concentration of the n-type layer 23 is preferably (0.6 to 3)$\times 10^{16}$ cm$^{-3}$. This is because if there is a large difference in impurity concentration in the pn junction 25, carrier injection efficiency from the p-type layer 24 to the n-type layer 23 becomes high and accordingly electrluminescence efficiency is increased. The n-type layer 23 serves substantially as a light-emitting layer. Silicon Si contained in the n-type layer 23 becomes donor which does not directly contribute to emmission of light. Therefore, as described above, ammonia gas is introduced into the atmosphere to remove silicon Si. It is well known that by an introduction of ammonia gas into the atmosphere, the n-type layer 23 is doped with nitrogen N in the ammonia gas and as a result, electroluminescence efficiency is increased and light wavelength is shifted to the long wavelength. This will be explained with reference to the drawing. FIG. 9 is a characteristic view showing relation between wavelength and electroluminescnece efficiency in various light-emitting diodes. In case where the n-type layer 23 is not actively doped with nitrogen N, nitrogen concentration becomes approximately $10^{16}$ cm$^{-3}$. In this case, if an n-type layer 21 of high concentration is provided as in a light-emitting diode 2 of the present invention, a curve C3 is obtained, and if such n-type layer of high concentration is not provided as in a conventional light-emitting diode 1, a curve C4 is obtained. Central wavelength in the curves C3 and C4 is approximately 556 nm. In case where the n-type layer 23 is actively doped with nitrogen N, nitrogen concentration becomes $10^{18}$ to $10^{19}$ cm$^{-3}$. In this latter case, if an n-type layer 21 of high concentration is provided as in a light-emitting diode 2 of the present invention, a curve C1 is obtained and if such n-type layer of high concentration is not provided as in a conventional light-emitting diode 1, a curve C2 is obtained. Central wavelength in the curves C1 and C2 is approximately 568 nm. As can be seen from FIG. 9, whether active doping of nitrogen N is made or not, a light-emitting diode 2 in accordance with the present invention has higher electroluminescnece efficiency than that in a conventional light-emitting diode.

Finally, the p-type layer 24 will be described. The impurity concentration of the p-type layer 24 is preferably (5 to 10)$\times 10^{17}$ cm$^{-3}$. This is because with a too high a value of impurity concentration, perfection of crystal could not be maintained or light absorption would occur.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A gallium phosphide light-emitting diode comprising;

an n-type substrate (20) of gallium phosphide, a first n-type layer (21) formed on said n-type substrate (20) having an impurity concentration higher than that of said n-type substrate (20), a second n-type layer (23) formed over said first n-type layer (21) having an impurity concentration lower than that of said n-type substrate (20), and a p-type layer (24) formed on said second n-type (23) thereby forming a pn junction (25) with said second n-type layer (23).

2. A gallium phosphide light-emitting diode in accordance with claim 1, wherein the impurity concentration of said first n-type layer (21) is (to 10)$\times 10^{17}$ cm$^{-3}$.

3. A gallium phosphide light-emitting diode in accordance with claim 2, wherein the impurity concentration of said first n-type layer (21) is (5 to 8)×$10^{17}$ cm$^{-3}$.

4. A gallium phosphide light-emitting diode in accordance with claim 1, wherein
the thickness of said first n-type layer (21) is more than 35 μm.

5. A gallium phosphide light-emitting diode in accordance with claim 1, wherein
said first n-type layer (21) contains sulfur as a main impurity and further contains a slight amount of silicon.

6. A gallium phosphide light-emitting diode in accordance with claim 5, wherein
the concentration of said silicon is (5 to 6)×$10^{16}$ cm$^{-3}$.

7. A gallium phosphide light-emitting diode in accordance with claim 1, wherein
said second n-type layer (23) contains nitrogen.

8. A gallium phosphide light-emitting diode in accordance with claim 1, wherein
the impurity concentration of said second n-type layer (23) is (0.6 to 3)×$10^{16}$ cm$^{-3}$.

9. A gallium phosphide light-emitting diode in accordance with claim 1, wherein
the impurity concentration of said n-type substrate (20) is (1 to 3)×$10^{17}$ cm$^{-3}$.

10. A gallium phosphide light-emitting diode in accordance with claim 1, which further comprises
a third n-type layer (22) formed between said first n-type layer (21) and said second n-type layer (23).

11. A gallium phosphide light-emitting diode in accordance with claim 10, wherein
the impurity concentration of said third n-type layer (22) is gradually decreased from the side of said first n-type layer (21) to the side of said second n-type layer (23).

12. A gallium phosphide light-emitting diode in accordance with claim 10, wherein
the impurity concentration of said third n-type layer (22) is decreased by steps from the side of said first n-type layer (21) to the side of said second n-type layer (23).

* * * * *